US012733093B2

(12) United States Patent
Amla et al.

(10) Patent No.: US 12,733,093 B2
(45) Date of Patent: Sep. 8, 2026

(54) USE OF INORGANIC THIN NON-WOVEN DIELECTRICS IN PRINTED CIRCUIT BOARDS

(71) Applicant: ADVANCED CHIP AND CIRCUIT MATERIALS, INC., San Jose, CA (US)

(72) Inventors: Tarun Amla, San Jose, CA (US); Keshav Amla, San Jose, CA (US); Jyoti Amla, San Jose, CA (US)

(73) Assignee: ADVANCED CHIP AND CIRCUIT MATERIALS, INC., San Jose, CA (US)

( * ) Notice: Subject to any disclaimer, the term of this patent is extended or adjusted under 35 U.S.C. 154(b) by 0 days.

(21) Appl. No.: 19/350,791

(22) Filed: Oct. 6, 2025

(65) Prior Publication Data

US 2026/0040443 A1 Feb. 5, 2026

Related U.S. Application Data

(62) Division of application No. 18/130,768, filed on Apr. 4, 2023, now Pat. No. 12,439,513.

(51) Int. Cl.
*H05K 1/03* (2006.01)

(52) U.S. Cl.
CPC ... *H05K 1/0366* (2013.01); *H05K 2201/0293* (2013.01); *H05K 2201/068* (2013.01)

(58) Field of Classification Search
CPC ......... H05K 1/0366; H05K 2201/0293; H05K 2201/068
See application file for complete search history.

(56) References Cited

U.S. PATENT DOCUMENTS 11,596,066 B1 2/2023 Amla et al.
2004/0089471 A1 5/2004 Andoh et al.
2007/0077413 A1 4/2007 Amou et al.
2014/0374142 A1 12/2014 Inoue et al.
2015/0299457 A1* 10/2015 Fu ........................ H05K 7/2039 428/35.8
2016/0297967 A1 10/2016 Jung et al.
2016/0362527 A1* 12/2016 Koes .................... H05K 1/0373
2019/0284393 A1 9/2019 Jung et al.

FOREIGN PATENT DOCUMENTS

CN 115302869 A 11/2022
TW I334431 B 12/2010
TW I453117 B 9/2014
TW 201915091 A 4/2019

OTHER PUBLICATIONS

English Translation for Schaefer (DE 10313399 A1) (Year: 2003).*
Author Unknown, Sabic Noryl SA9000 Solvent Guide (Year: 2019).*
Tarzwell et al.l, High Voltage Printed Circuit Design & Manufacturing Notebook, Sierra Proto Express (Year: 2004).*
Third Party Observation and its English translation for Taiwanese Application No. 113112976 dated Mar. 10, 2026.
Notification of Third Party Observation for Taiwanese Application No. 113112976 dated Mar. 2, 2026.

* cited by examiner

*Primary Examiner* — Nathan L Van Sell
(74) *Attorney, Agent, or Firm* — Lando & Anastasi, LLP

(57) ABSTRACT

Dielectric materials including non-woven inorganic fabrics impregnated with a low-density resin are disclosed. The dielectric materials may have a thickness in a range of about 5 to about 125 microns for use in printed circuit boards.

21 Claims, No Drawings

USE OF INORGANIC THIN NON-WOVEN DIELECTRICS IN PRINTED CIRCUIT BOARDS

CROSS-REFERENCE TO RELATED APPLICATION

This application is a divisional application of U.S. patent application Ser. No. 18/130,768, filed Apr. 4, 2023, and titled "USE OF INORGANIC THIN NON-WOVEN DIELECTRICS IN PRINTED CIRCUIT BOARDS," the entire disclosure of which is hereby incorporated herein by reference in its entirety for all purposes.

FIELD OF TECHNOLOGY

Aspects relate generally to printed circuit boards and, more particularly, to those including inorganic, non-woven reinforced dielectrics as well as related methods of manufacture.

BACKGROUND

The need for smaller, thinner, and lighter devices is driving the need for next generation printed circuit boards with smaller form factors and higher circuit density. Printed circuit boards may include single sided, double sided, multilayer and high density interconnect boards. The boards are used in almost all electronic and communication applications including chip packaging and high speed digital applications. With successive generations of these devices there has been a greater emphasis on reducing the thickness of the products, reducing the dielectric constant, reducing the dissipation factor to reduce the insertion loss, and improving the functionality. The need for advancements is driven by the need to reduce the feature size of the lines and spacings of the circuits used, which requires the use of increasingly thinner dielectric materials.

The solutions available for thin dielectrics are the use of unreinforced films as dielectrics, woven glass reinforced dielectrics or resin coated copper. The non-reinforced films do not have the rheological properties to provide close thickness control, nor the mechanical stiffness required to support the printed circuit board and the components. These films are hard to process and require specialized processes. The CTEs (coefficient of thermal expansion) of these films are also very high at least in the planar direction, leading to mismatch with the substrate materials and the integrated circuits (IC), leading to poor thermal reliability and other assembly concerns. The films are also not free standing and are very difficult to process, as they need to be supported by carrier films. The glass transition temperature (Tg) for these films is also typically low, leading to high expansion in the z direction, negatively affecting interconnect reliability. Another solution that has been tried are resin coated copper (RCC) structures. This solution also suffers from the same issues as the films, since the materials are prone to cracking and hard to process, leading to reliability and manufacturability issues. Conventional woven materials are also unsuitable as they are prone to skew distortions and cannot reach the thickness requirements necessary for very thin structures. In addition to the high degree of yield loss with trying to achieve low thickness with woven glass, notwithstanding the very high cost of the thin fabrics, weave skew and planarity is still an issue with woven fabrics.

SUMMARY

In accordance with one or more aspects, a printed circuit board is disclosed. The printed circuit board may include at least one dielectric material layer comprising a non-woven, inorganic fabric reinforcement, the at least one dielectric layer material having a thickness of less than about 125 microns.

In some aspects, the at least one dielectric material layer may have a thickness of less than about 100 microns. For example, the at least one dielectric material layer may have a thickness of less than about 75 microns. In some non-limiting aspects, the at least one dielectric material layer may have a thickness of less than about 50 microns. In some non-limiting aspects, the at least one dielectric material layer may have a thickness of less than about 40 microns. In at least some non-limiting aspects, the at least one dielectric material layer may have a thickness of less than about 25 microns. The at least one dielectric material layer may have a thickness of less than about 15 microns.

In some aspects, the at least one dielectric material layer may comprise a prepreg or a laminate.

In some aspects, the non-woven, inorganic fabric reinforcement may be impregnated with a crosslinked thermosetting polymer resin. The crosslinked thermosetting polymer resin may comprise an epoxy resin, a bismaleimide resin, a cyanate ester resin, a BT resin, a polybutadiene resin, or a PPE/PPO resin. The crosslinked thermosetting polymer resin may comprise at least one resin selected from the group consisting of: a vinyl functional PPE resin, an OPE resin, a Bismaleimide resin, a Triallyl Cyanurate resin and a Tri Allyl Isocyanurate resin.

In some aspects, the crosslinked thermosetting polymer resin may be substantially halogen free. The crosslinked thermosetting polymer resin may further include at least one of a flame retardant, a curing agent, a hardener, a filler, and an additive.

In some aspects, the at least one dielectric material may be less than about 20% filler by weight. The at least one dielectric material may be copper clad.

In some aspects, the non-woven, inorganic fabric reinforcement may be higher DK (>5.0) glass such as E-glass, S-2 Glass, R Glass, or ECR Glass. In other aspects, the non-woven, inorganic fabric reinforcement may be Quartz, L-glass, NE Glass, or D Glass.

In some aspects, the at least one dielectric material may be characterized by a glass transition temperature (Tg) of greater than about 150° C.

In some aspects, the at least one dielectric material is characterized by a dielectric constant (DK) of less than about 3.5. For example, the at least one dielectric material may be characterized by a dielectric constant (DK) of less than about 3.0. In some non-limiting aspects, the at least one dielectric material may be characterized by a dielectric constant (DK) of less than about 2.8. In at least some non-limiting aspects, the at least one dielectric material may be characterized by a dielectric constant (DK) of less than about 2.5.

In some aspects, the at least one dielectric material may be characterized by a tensile modulus in the planar directions of less than about 5 GPa.

In some aspects, the coefficient of thermal expansion (CTE) of the at least one dielectric material may be less than about 35 ppm in either of the planar directions over a temperature range of about 50° C. to about 220° C.

In some aspects, the printed circuit board may be a high density interconnect (HDI) printed circuit board.

In accordance with one or more aspects, a high speed board, high frequency board or chip packaging substrate including any printed circuit board as described herein is disclosed.

In accordance with one or more aspects, a method of facilitating preparation of a printed circuit board is disclosed. The method may involve providing at least one dielectric material layer comprising a non-woven, inorganic fabric reinforcement, the at least one dielectric material layer having a thickness of less than about 125 microns.

In some aspects, the method may further involve providing instructions for integrating the at least one dielectric material layer into the printed circuit board.

In accordance with one or more aspects, a method of making a dielectric material is disclosed. The method may involve providing a non-woven, inorganic fabric reinforcement, impregnating the reinforcement with a low-density thermosetting polymer resin, drying the impregnated reinforcement and pressing the dried impregnated reinforcement to form a dielectric material having a thickness of less than about 125 microns.

In some aspects, the non-woven, inorganic fabric reinforcement may have a thickness of less than about 220 microns.

In some aspects, the non-woven, inorganic fabric reinforcement may be E-glass, Quartz, L-glass, NE Glass, or D Glass.

In some aspects, the resin may include an epoxy resin, a bismaleimide resin, a cyanate ester resin, a BT resin, a polybutadiene resin, or a PPE/PPO resin, a vinyl functional PPE resin, an OPE resin, a Bismaleimide resin, a Triallyl Cyanurate resin or a Tri Allyl Isocyanurate resin.

In some aspects, the resin may further include at least one of a flame retardant, a curing agent, a hardener, a filler, and an additive.

In some aspects, the density of the resin is less than about 1.6 g/cc. For example, the density of the resin may be less than about 1.2 g/cc. In some specific non-limiting aspects, the density of the resin may be less than about 1.05 g/cc.

In some aspects, the viscosity of the resin may be between about 50 cPs and about 1500 cPs.

In some aspects, drying may be performed in a horizontal oven at a temperature of from about 100° C. to about 200° C.

In some aspects, the method may further involve controlling a thickness of the impregnated reinforcement prior to drying with a squeeze roll, slot die, doctor blade or gravure. The method may further involve copper cladding the dielectric material. The method may further involve supporting the dielectric material with a foil, release, or carrier film.

In some aspects, the dielectric material layer may have a thickness of less than about 25 microns.

Described herein are inorganic non-woven fabric reinforced dielectric materials and copper clad laminates for use in printed circuit boards for high speed digital applications including HDI boards. In the current state of the art, it is conventionally understood that non-woven reinforced dielectric materials result in high thickness not suitable for high layer count boards. In accordance with one or more aspects of the present disclosure, lower thickness is surprisingly achieved with non-woven fabrics making them suitable for use in printed circuit boards.

One aspect of the invention is the use of non-woven reinforced dielectric layers, with inorganic non-woven fabric, with a pressed thickness of below 125 microns for use in a single or multiple layers of printed circuit boards.

In some embodiments the original thickness of the non-woven fabric is below 220 microns.

In some embodiments, the dielectric materials may or may not be clad with copper.

In preferred embodiments, the Tg of the non-woven reinforced dielectric materials is greater than about 150° C. The non-woven fabric reinforced dielectrics of the present disclosure also have high Tg, e.g., greater than about 150° C. and as high as about 300° C. in some embodiments. In some embodiments, the dielectrics may have a low dielectric constant.

It is also conventionally understood in the current state of the art that non-woven reinforced dielectric materials have undesirably high CTEs in the planar direction and, in the case of low Tg systems, very high CTEs in the thickness or z-direction. The non-woven fabric reinforced dielectrics in accordance with the present disclosure beneficially have low CTEs in the planar direction and low Z-axis expansion. In some embodiments, the non-woven fabric reinforced materials have a planar CTE less than 35 ppm/c.

Likewise, it is expected in the relevant art that printed circuit board materials in general have dielectric constants higher than 3.5. In the present disclosure, some embodiments may beneficially have a dielectric constant lower than about 3.2. In some specific non-limiting embodiments, the non-woven fabric reinforced material may have a dielectric constant of less than about 2.8. In other embodiments the DK can be lower than 2.6. The lower DK provides a major advantage such that the line widths required to achieve the same impedance are wider for the same thickness thereby reducing the insertion loss significantly. The insertion loss comprises of dielectric loss and conductor loss. The conductor loss is inversely proportional to the line width, which, for the same thickness, is wider for a lower DK. A DK reduction, therefore, directly reduces the conductor loss. The dielectric loss is directly proportional to the square root of the dielectric constant and therefore a lower dielectric constant reduces the dielectric loss. The lower dielectric constant is typically not possible with woven glass fabric due to the fact that woven fabrics cannot easily achieve very high resin contents. In the example below, the insertion loss is simulated using commercially available Gauss 2D Software, for a 127 micron Dielectric with 50 Ohm impedance.

Insertion Loss for a Single ended Stripline 50 Ohm 127 Micron dieletric 35 micron trace height

| DK | DF | Line Width for 50 Ohms Stripline | Insertion loss dB/m | % Difference from 3.5 DK |
|---|---|---|---|---|
| 3.50 | 0.002 | 102.7 | 21.85 | 0.0% |
| 3.20 | 0.002 | 114.2 | 20.15 | 7.8% |
| 3.00 | 0.002 | 122.6 | 19.05 | 12.8% |
| 2.80 | 0.002 | 132.1 | 17.97 | 17.8% |
| 2.60 | 0.002 | 141.9 | 16.93 | 22.5% |

In some embodiments, the thickness of the pressed dielectric material layer may be lower than about 15 microns.

In accordance with one or more embodiments, a higher density resin leads to higher thickness. It is known in the art that halogenated resins have higher density and adding filler increases the density. In some embodiments of the invention, the laminate resin is substantially halogen free, and at least some embodiments include use of no to low inorganic filler(s). For example, inorganic filler(s) may constitute less than about 20% by weight of the total weight of non-woven fabric and the curing resin in accordance with one or more embodiments. Such embodiments may advantageously provide for low thickness and improved dimensional stability even after several lamination cycles.

In some specific embodiments, the non-woven inorganic fabric is quartz veil using an epoxy, phenolic, styrene or Polyimide binder. In other specific embodiments, the non-woven inorganic fabric is comprised of Glass including E-Glass, L-glass, or D-Glass using binders such as polyvinyl alcohol (PVA).

The disclosure contemplates all combinations of any one or more of the foregoing aspects and/or embodiments, as well as combinations with any one or more of the embodiments set forth in the detailed description and any examples.

DETAILED DESCRIPTION

In accordance with one or more embodiments, non-woven inorganic fabrics which are impregnated with a low-density resin may deliver a dielectric material layer having a thickness in the range of about 5 to about 125 microns. Such dielectric materials may be particularly suitable for use in high layer count applications as well as in HDI printed circuit boards. The fabrics may have a starting thickness of greater than about 50 microns, wherein a thickness reduction of up to or greater than about 25% of the original untreated fabric may be achieved. The dielectric material composites may be characterized by relatively low in-plane CTEs. Beneficially, while the dielectric constant (DK) for traditional woven glass reinforced material is around 2.9 to about 3.5, in some embodiments, the non-woven reinforcements of the present invention may be characterized by a DK of less than about 2.6. This is otherwise only possible with thermoplastics, such as PTFE, or pure films.

In accordance with one or more embodiments, a printed circuit board may include at least one dielectric material layer comprising a non-woven, inorganic fabric reinforcement, the at least one dielectric material layer having a thickness of less than about 125 microns.

Based on conventional wisdom, the way to reduce the pressed thickness of non-woven fabrics may involve using high density resins which are filled with inorganic filler so as to reduce the overall thickness. Based on the work done pertaining to the present invention, unexpected results are seen when using low density resins. It is possible to see very high thickness reduction over the original untreated fabric thickness when using low-filled or unfilled resins, which are low density by themselves. A key requirement is that substantially all the non-woven fabric has to be fully encapsulated and filled otherwise it will have voids and will not be of use. The invention works if a low density, low-filler or unfilled resin is used to impregnate non-woven fabrics.

The present invention relates to laminates and prepregs that include a non-woven inorganic fabric as reinforcement for use as a single or multiple layers in a printed circuit board. The thickness of the laminate or pressed prepreg may range from between about 10 and about 125 microns. In some embodiments, the thickness may be lower than about 125 microns. In at least some embodiments, the thickness may be lower than about 100 microns, e.g., less than about 75 microns, less than about 50 microns, less than about 40 microns, less than about 25 microns or less than about 15 microns.

In accordance with one or more non-limiting embodiments, a prepreg may refer to a b-staged, or partially cured, dielectric material layer comprising a fabric that has been impregnated with a resin and dried.

In accordance with one or more non-limiting embodiments, a laminate may refer to a c-staged, or substantially fully cured, dielectric material layer or stack of multiple dielectric material layers that may or may not be clad with copper or another conductive material. A laminate may generally be formed from one or multiple prepregs by application of pressure and temperature.

In accordance with one or more non-limiting embodiments, a "dielectric material layer" or "dielectric layer" may refer to a b-staged or c-staged dielectric material that comprises a single ply of fabric that has been impregnated with a resin.

In accordance with one or more embodiments, the dielectric material may be characterized by a glass transition temperature (Tg) of greater than about 150° C.

In accordance with one or more embodiments, the dielectric material may be characterized by a dielectric constant (DK) of less than about 3.5, e.g., less than about 3.0, less than about 2.8, or less than about 2.5.

In accordance with one or more embodiments, the dielectric material may be characterized by a tensile modulus in the planar directions of less than about 5 GPa.

In accordance with one or more embodiments, the coefficient of thermal expansion (CTE) of the dielectric material may be less than about 35 ppm in either of the planar directions over a temperature range of about 50° C. to about 220° C.

In accordance with one or more embodiments, various non-woven, inorganic fabric reinforcements may be used. In some embodiments, the reinforcement may be higher DK (>5.0) glass, such as E-glass, S-2 Glass, R Glass, or ECR Glass. In other embodiments, the non-woven, inorganic fabric reinforcement is Quartz, L-glass, NE Glass, or D Glass. In preferred embodiments, E glass or quartz non-woven fabric may be used as the reinforcement. In some embodiments, quartz veil commercially available from Saint Gobain may be used. In some embodiments, E-glass commercially available from Mativ may be used.

In accordance with one or more embodiments, the non-woven, inorganic fabric reinforcement may have a thickness of less than about 220 microns prior to processing. A thickness reduction of up to or greater than about 25% of the original untreated fabric may be achieved.

In accordance with one or more embodiments, a non-woven reinforcement may generally be characterized by a low dissipation factor. In some embodiments, the dissipation factor of the non-woven reinforcement is less than about 0.008. In at least some embodiments, the dissipation factor of the non-woven reinforcement is less than about 0.003. In some specific non-limiting embodiments, the dissipation factor of the non-woven reinforcement may be less than about 0.002.

In accordance with one or more embodiments, the dielectric constant of the non-woven reinforcement is preferably less than about 7.0.

In accordance with one or more embodiments, the resin used for impregnating the non-woven inorganic fabric may be a crosslinked thermosetting polymer composition. A wide range of possible resin systems can be used, including but not limited to epoxies, bismaleimides, cyanate esters, BT, polybutadiene, and PPE/PPO. In some embodiments, the polymer system may include at least one resin selected from the group consisting of: a vinyl functional PPE resin, an OPE resin, a Bismaleimide resin, a Triallyl Cyanurate resin and a Tri Allyl Isocyanurate resin.

In some embodiments, the resin system may include one or more hardener, such as TAIC/TAC, polybutadienes, styrene butadienes, maleic anhydrides and/or amines.

In some embodiments, the resin system may include flame retardants, such as phosphinates, Phosphazene and/or DOPO.

In some embodiments, the resin system may include various fillers and additives, such as Silica, Talc and/or glass microspheres. In some embodiments, the resulting dielectric material may be less than about 20% by weight filler.

In at least some embodiments, the resin system may be substantially halogen free.

In some embodiments the non-woven dielectric laminates and prepregs can be made using combinations of materials such as vinyl functional PPE available from Sabic corporation such as SA9000, or OPE resins from Mitsubishi chemicals, Bismaleimide resins such as BMI 5100, BMI 2300 available from Daiwa Kasei of Japan or GMI 5100 from Shin A Tec of South Korea, Triallyl Cyanurate or Tri Allyl Isocyanurate available from Evonik corporations. Fillers such as Fused Silica, Talc or air filled microspheres may be used.

In preferred embodiments of the resin, combinations of functionalized PPE and of Triallyl Cyanurate/Triallyl Isocyanurate and/or butadiene styrene polymers such as Ricon 100, Ricon 257 and Polymers of butadiene such as Ricon 134, Ricon 154, Ricon 156, and Ricon 157 available from Total with flame retardants and fillers and a peroxide agent are used. In the preferred embodiment, the curing agent is a peroxide agent. Examples of peroxide curing agents include dicumyl peroxide, Benzoyl peroxide, lauroyl peroxide, 2-Butanone peroxide, and mixtures comprising one or more of the peroxide curing agents. The curing agent is present in an amount of about 0.25 wt. % to about 6 wt. %, based on the total weight of the resin. In some embodiments Spherical Silica, Talc, Hexagonal Boron Nitride, glass filled microspheres are used. Flame retardant such as Exolit® OP935 or Exolit® OP945 Aluminum Poly Phosphinate available from Clariant corporation, SPB100 or Phosphazene available from Otsuka chemical corporation can also be used as a flame retardant for halogen free embodiments. In some embodiments phosphorated compounds such as Altexia from Albemarle or PQ 60 from Chin Yee chemicals may also be used, alone or in combination with other flame retardants.

In halogenated embodiments, flame retardants such as Saytex 8010, Ethylene-1,2-bis (pentabromophenyl) or BT 93 from Albemarle corporation can be used.

In optional embodiments, epoxy resins cured with SMA type hardeners may be used with combination of Cyanate esters with accelerators such 2-MI, 2.4 EMI.

In accordance with one or more embodiments, the resin may be characterized as a low density resin. In some embodiments, the resin system may have a density of less than about 1.6 g/cc. In other embodiments, the density of the resin may be less than about 1.2 g/cc, e.g., less than about 1.05 g/cc.

In some embodiments, the viscosity of the resin can range from about 50 centipoise to greater than about 1500 centipoise, depending on the solvent and filler loadings.

In accordance with one or more embodiments, the resin used for impregnation may be characterized by low loss and low DK so as to impart a low dissipation factor and dielectric constant. For example, resins including PPE as well as Styrene Butadiene type systems may be used. In some embodiments the neat resin DK is less than about 3.5. In preferred embodiments, the DK of the neat resin is less than about 3.0. In some embodiments, the DK of the neat resin may be less than about 2.5. The dissipation factor (DF) of the neat resin may be less than about 0.010 in some embodiments. In preferred embodiments, the DF of the resin may be less than about 0.005. In some embodiments, the DF of the resin may be less than about 0.0025.

The resin system can generally impregnate the inorganic fiber so that the overall pressed thickness is reduced after lamination. In at least some nonlimiting embodiments, a pressure of greater than about 50 psi and heat greater than about 100° C., preferably in excess of 150° C., may be applied to provide full cure and crosslinking of the resin system.

In some embodiments, provided herein are methods of manufacturing a sheet of dielectric material. In a preferred embodiment, the non-woven fabrics are fully impregnated in a dip pan and then sent through squeeze rolls or through slot dies to achieve the thickness requirements. The viscosity of the varnish can range from about 50 cPs to about 1500 cPs depending on the filler content and desired thickness.

The process of manufacture generally includes the use of horizontal or vertical treaters. The horizontal ovens are typically float-on-air/air floatation, while the vertical ovens are usually infrared or convection with air impingement. Horizontal treating is preferred, due to the lower wet strength of non-woven fabrics. For better thickness control, slot die, doctor blade, gravure, or other techniques are used. The ovens in the preferred embodiments are horizontal float-on-air dryers. The web can also be guided over rollers or guided at the edge. The horizontal dryers enable improved parameters and higher yields as the web does not have the higher tension associated with vertical dryers. The horizontal ovens provide the additional benefit of lower binder percentage which are otherwise required to improve the tear strength of the non-woven fabric to make them suitable for use with the vertical dryers. The temperature for treating can be between 100° C. to 200° C. with about 120° C. to about 175° C. preferred. The oven temperature range is typically over 150° C. at the hottest sections. The temperature profile and speed may be adjusted in accordance with the boiling range of the solvents.

In accordance with one or more embodiments, the processing may reduce the pressed thickness of the non-woven fabric reinforcement by at least about 25%. In some embodiments, the thickness may be reduced by at least about 35%, e.g., by at least about 45%.

In accordance with one or more embodiments, the dielectric material may be b-staged or c-staged upon cure. The dielectric material may be a prepreg or laminate.

In some embodiments, the dielectric material may be clad, e.g. copper clad.

In some embodiments, the non-woven fabric reinforced dielectric can be laminated onto copper foil to facilitate easy application for printed circuit board fabrication. In optional embodiments the non-woven fabric based prepreg is supported by a release or carrier film such as PET. In at least some embodiments, the web may be substantially unsupported.

Printed circuit boards are of many types ranging from single sided to double sided to multilayer boards. A single lamination multilayer printed circuit board (PCB) is built by layering multiple sheets of copper-clad fiberglass or other insulating substrate material together, with each layer containing a different pattern of conductive traces and vias that interconnect the components and circuits on the board. The basic steps involved in building a multilayer PCB are as follows. The PCB design is created using computer-aided design (CAD) software. The design specifies the number of layers required, the layout of the circuitry, the location and size of the components, and the placement of the vias. Copper clad laminates (cores) are coated with a photoresistive material. The PCB design is printed onto the photoresistive material, and the unwanted areas are exposed to UV light. The exposed areas are then chemically etched away, leaving only the copper traces and vias. Once all the layers have been created, they are aligned and bonded together using the prepreg layers/bonding sheets. Small holes are drilled through the board at the locations where the vias are needed to connect the layers. The holes are plated with copper to create a conductive connection between the layers. The outer layers are then chemically etched to remove the unwanted copper and coated with a protective solder mask and silk screen to identify the component locations and other information. The board is cut to its final size, and any necessary finishing processes, such as surface plating, are applied.

High density interconnect (HDI) boards differ from single lamination type boards. The process of making HDI board depends on the type of the HDI board. Typically, different types of HDI boards depend on the type and number of sequential layers. Different types of HDI boards include 1+n+1, or i+n+i—when n=2, then it is called any-layer HDI process. The layers are built sequentially. In an any-layer process, the central core is processed and plated, followed by lamination with a dielectric layer comprising of a prepreg and copper on either side. The subtractive etching process technology is suitable for boards that have lines and spacings more than typically 50 microns. For thinner lines and spacings as in advanced mobile devices and for chip packaging the lamination may be done without copper or with ultrathin copper on a carrier. The process is followed by etching of the copper and laser drilling, hole filling and plating. The next set of layers are built up after that. When thinner lines, typically below 50 microns, are required, either a mSAP (modified semi additive process) or, for still thinner lines below 25 microns, a semi additive process is used. In modified semi additive process or mSAP, a very thin layer of copper is laminated with the prepreg layer. The typical thickness of the foil ranges from 2-5 microns. Once this seed copper or base copper is in place, standard photolithography techniques are used to create the circuit and then the circuitry is plated up to the desired thickness. The resist can then be stripped, and the panel is flash etched to remove the excess copper.

The semi additive process may or may not require a copper base layer. The lamination can be done without copper or using prepreg that has sputtered copper layers. The seed layer can then be deposited using an electroless process. The standard lithography processes are used in conjunction with develop, etch and strip processes to create the circuit pattern, which are then followed by subsequent steps familiar to one in the art. The present invention is easy to implement in the HDI process using the non-woven reinforced prepregs or laminates. The layers do not require a support or a carrier, though carriers may be used. There is no need for vacuum dry lamination as is required for using films, which need to be vacuum laminated on to the board. The present invention allows the manufacturer to proceed directly to the press lamination.

In accordance with one or more embodiments, preparation of a printed circuit board may be facilitated by providing at least one dielectric material layer comprising a non-woven, inorganic fabric reinforcement, the at least one dielectric material layer having a thickness of less than about 125 microns. Instructions may be provided for integrating the at least one dielectric material layer into the printed circuit board.

In accordance with one or more embodiments, various components may include a printed circuit board as described herein, for example, a high speed board, a high frequency board or chip packaging substrate.

The function and advantages of these and other embodiments can be better understood from the following examples. These examples are intended to be illustrative in nature and are not considered to be limiting the scope of the invention.

Example 1

Various resin formulations were prepared and a number of non-woven reinforcements of different thickness were treated/impregnated with the formulations and pressed. The pressed laminates were tested for a number of properties including thickness Tg, Expansion and Peels. An example of the polymer formulation is noted below:

| Ingredient | Wt gms |
|---|---|
| BMI 5100 | 12.79 |
| TAIC | 4.51 |
| OP 945 | 2.26 |
| SPB100 | 4.51 |
| Strypene Butadiene Polymer | 21.07 |
| Spherical Silica | 13.53 |
| Dicup | 1.15 |
| MEK | 40.18 |
| Total | 100.00 |

BMI was dissolved in MEK after heating to 50° C., Styrene Butadiene resin and TAIC were added next followed by the flame retardants. Silica was added after Dicup. The resin was used to impregnate non-woven fabric and the fabric was dried at 150° C. for 4 minutes in a Class A oven. The material was pressed at 225° C. for 2 hours.

The summary of the properties is given below.

| Non-Woven Type | Non-woven Fabric Original thickness Microns | After pressing Microns | Resin Content | Thickness Reduction % | Density g/cc | DK | Df | Tg |
|---|---|---|---|---|---|---|---|---|
| E Glass | 102 | 63.5 | 78.2% | 37.8% | 1.16151 | 3.07 | 0.00480 | >300 |
| E-Glass | 102 | 39.3 | 67.0% | 61.5% | 1.16151 | 3.18 | 0.00404 | >300 |
| Quartz | 220 | 99.7 | 78.4% | 54.7% | 1.16151 | 2.68 | 0.00202 | >300 |
| Quartz | 75 | 37.3 | 83.1% | 50.3% | 1.16151 | 2.64 | 0.00196 | >300 |

Example 2

Example polymer formulations are outlined below:

| Ingredients | A-Gms | B-Gms | C-Gms |
|---|---|---|---|
| PPE Resin | 34.05 | 26.60 | 17.12 |
| TAIC | 20.43 | 15.96 | 10.27 |

-continued

| Ingredients | A-Gms | B-Gms | C-Gms |
|---|---|---|---|
| Flame retardant | 10.21 | 7.98 | 5.14 |
| Styrene Butadiene Polymer | 3.40 | 2.66 | 1.71 |
| Spherical Silica | — | 15.43 | 34.25 |
| Peroxide | 1.74 | 1.36 | 0.87 |
| Toluene | 30.17 | 30.03 | 30.63 |
| Total | 100.00 | 100.00 | 100.00 |

The formulations were run with different filler loadings. The resin was used to impregnate non-woven fabric and the fabric was dried at 150° C. for 4 minutes in a Class A oven. The material was pressed at 225° C. for 2 hours.
The summary of the properties is given below.

| Type of Non-woven | Non-woven Fabric thickness micronss | After pressing Microns | Resin Content | Thickness Reduction | Density of the resin | Inorganic Filler percentage in the resin | DK SPDR 10 GHz. | Df SPDR 10 GHz. |
|---|---|---|---|---|---|---|---|---|
| Quartz | 75 | 38.6 | 81.7% | 48.5% | 1.020 | 0.0% | 2.510 | 0.00190 |
| Quartz | 75 | 23.6 | 72.0% | 68.5% | 1.020 | 0.0% | 2.587 | 0.00196 |
| Quartz | 130 | 58.5 | 77.9% | 55.0% | 1.020 | 0.0% | 3.040 | 0.00388 |
| E-Glass | 102 | 63.5 | 78.2% | 37.8% | 1.162 | 22.1% | 3.065 | 0.00174 |
| E-Glass | 102 | 39.3 | 67.0% | 61.5% | 1.162 | 22.0% | 3.182 | 0.00404 |
| E-Glass | 102 | 64.1 | 81.7% | 37.2% | 1.162 | 22.0% | 2.977 | 0.00367 |
| E-Glass | 102 | 70.88 | 83.0% | 30.5% | 1.380 | 49.5% | 3.189 | 0.00382 |

Example 3

Various properties as a function of filler content are given below:

| Filler Percent | Density | Modulus GPa X direction | Modulus GPa Y direction | Tg Max Tan Delta DMA C | (CTE X ppm/c (50-220) | (CTE Y ppm/c (50-220) | Peels Pli | TMA Tg C |
|---|---|---|---|---|---|---|---|---|
| 0 | 1.02 | 4.65 | 3.18 | 202 | 21.3 | 25.8 | >6 | 180 |
| 22 | 1.16 | 3.97 | 3.17 | 185 | 27.3 | 29.1 | >6 | 183 |
| 49 | 1.38 | 4.41 | 3.63 | 173 | 44.3 | 41.2 | >6 | 172 |

The data shows unexpected results in that as the filler percentage decreases, the CTE in X and Y direction decreases. High filler loadings are commonly used to reduce CTE.

Prophetic Example

Anticipated data for lower thickness and lower Resin content is shown below:

| Type of Non-woven | Non-woven Fabric thickness micronss | After pressing Microns | Resin Content | Thickness Reduction | Density of the resin | Inorganic Filler percentage in the resin |
|---|---|---|---|---|---|---|
| Quartz | 55 | 14.6 | 67.0% | 73.5% | 1.020 | 0.0% |
| Quartz | 75 | 19.4 | 67.0% | 74.1% | 1.020 | 0.0% |

The phraseology and terminology used herein is for the purpose of description and should not be regarded as limiting. As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure and are intended to be within the scope of the invention. Accordingly, the foregoing description and drawings are by way of example only.

Those skilled in the art should appreciate that the parameters and configurations described herein are exemplary and that actual parameters and/or configurations will depend on the specific application in which the disclosed methods and materials are used. Those skilled in the art should also recognize or be able to ascertain, using no more than routine experimentation, equivalents to the specific embodiments disclosed.

What is claimed is:

1. A method of making a dielectric material layer, comprising:

providing a non-woven, inorganic fabric reinforcement;

impregnating the reinforcement with a crosslinked thermosetting polymer resin;

drying the impregnated reinforcement; and pressing the dried impregnated reinforcement to form a dielectric material layer having a thickness of less than about 125 microns and characterized by a thickness reduction of at least 25% relative to a thickness of the non-woven, inorganic fabric reinforcement prior to pressing.

2. The method of claim 1, wherein the non-woven, inorganic fabric reinforcement has a thickness of less than about 220 microns prior to pressing.

3. The method of claim 1, wherein the non-woven, inorganic fabric reinforcement is E-glass, S-2 Glass, R Glass, or ECR Glass, Quartz, L-glass, NE Glass, or D Glass.

4. The method of claim 1, wherein the density of the resin is less than about 1.6 g/cc.

5. The method of claim 1, wherein the density of the resin is less than about 1.2 g/cc.

6. The method of claim 1, wherein the density of the resin is less than about 1.05 g/cc.

7. The method of claim 1, further comprising controlling a thickness of the impregnated reinforcement prior to drying with a squeeze roll, slot die, doctor blade or gravure.

8. The method of claim 1, further comprising supporting the dielectric material layer with a foil, release, or carrier film.

9. The method of claim 1, wherein the dielectric material layer has a thickness of less than about 100 microns.

10. The method of claim 9, wherein the dielectric material layer has a thickness of less than about 50 microns.

11. The method of claim 10, wherein the dielectric material layer has a thickness of less than about 25 microns.

12. The method of claim 1, wherein the crosslinked thermosetting polymer resin is characterized by a dissipation factor (DF) of less than about 0.010.

13. The method of claim 1, wherein the crosslinked thermosetting polymer resin further comprises at least one of a flame retardant, a curing agent, a hardener, a filler, and an additive.

14. The method of claim 1, wherein the crosslinked thermosetting polymer resin is substantially halogen-free.

15. The method of claim 1, wherein the crosslinked thermosetting polymer resin is a polyphenylene ether (PPE) and/or polyphenylene oxide (PPO) based crosslinked thermosetting polymer resin.

16. The method of claim 1, wherein the dielectric material layer is characterized by a glass transition temperature (Tg) of greater than about 150° C.

17. The method of claim 1, wherein the dielectric material layer is characterized by a coefficient of thermal expansion (CTE) of less than about 35 ppm in either of the planar directions over a temperature range of about 50° C. to about 220° C.

18. The method of claim 1, wherein the dielectric material layer is characterized by a tensile modulus in the planar directions of less than about 5 GPa.

19. The method of claim 1, wherein the dielectric material layer is characterized by a dielectric constant (DK) of less than about 3.5.

20. The method of claim 19, wherein the dielectric material layer is characterized by a dielectric constant (DK) of less than about 3.0.

21. The method of claim 20, wherein the dielectric material layer is characterized by a dielectric constant (DK) of less than about 2.8.

* * * * *